United States Patent [19]

Siemsen et al.

[11] Patent Number: 4,465,334

[45] Date of Patent: Aug. 14, 1984

[54] MULTILAYER FIBER LIGHT CONDUCTOR

[75] Inventors: Dieter Siemsen, Haar; Guenther Sepp, Ottobrunn, both of Fed. Rep. of Germany

[73] Assignee: Messerschmitt-Boelkow-Blohm Gesellschaft mit beschraenkter Haftung, Munich, Fed. Rep. of Germany

[21] Appl. No.: 316,987

[22] Filed: Nov. 2, 1981

[30] Foreign Application Priority Data

Nov. 13, 1980 [DE] Fed. Rep. of Germany ....... 3042795

[51] Int. Cl.$^3$ ................................................ G02B 5/14
[52] U.S. Cl. ............................... 350/96.33; 350/96.30;
350/96.31; 356/350
[58] Field of Search ............... 350/96.30, 96.31, 96.33;
356/350

[56] References Cited

U.S. PATENT DOCUMENTS

| | | | |
|---|---|---|---|
| 4,184,744 | 1/1980 | Onoda et al. ...................... | 350/96.33 |
| 4,265,515 | 5/1981 | Kao ................................... | 350/96.33 |
| 4,372,647 | 2/1983 | Okamoto et al. ............ | 350/96.33 X |
| 4,376,248 | 3/1983 | Giallorenzi et al. ............... | 250/227 |
| 4,378,497 | 3/1983 | Giallorenzi ......................... | 250/227 |
| 4,417,782 | 11/1983 | Clarke et al. ................ | 350/96.33 X |

FOREIGN PATENT DOCUMENTS 2352003  4/1978  Fed. Rep. of Germany .

OTHER PUBLICATIONS

J. B. Almeida et al., On Line-Metal Coating of Optical Fibers Optik, vol. 53, No. 3, Jun. 1979, pp. 231-233.

Primary Examiner—David K. Moore
Assistant Examiner—Akm E. Ullah
Attorney, Agent, or Firm—W. G. Fasse; D. H. Kane, Jr.

[57] ABSTRACT

The present multilayer fiber light conductor has two concentric light conducting zones for use in so-called mode interference methods. The two light conducting zones are so constructed that each zone has a different mode transit or propagation time relative to the same length of the respective zone.

11 Claims, 3 Drawing Figures

MULTILAYER FIBER LIGHT CONDUCTOR

CROSS-REFERENCE TO RELATED APPLICATION

The present application is based on German Ser. No. P 30 42 795.3, filed in the Federal Rupublic of Germany on Nov. 13, 1980. The priority of the German filing date is claimed for the present application. The present application is also related to our copending application: U.S. Ser. No.: 317,167, filed on Nov. 2, 1981, and based on German Ser. No.: P 30 42 794.2.

BACKGROUND OF THE INVENTION

The present invention relates to a multilayer fiber light conductor which is especially suitable for use in so-called mode interference methods.

Optical science knows that interferometric devices may be grouped with the most sensitive and most precise measuring devices. This also applies substantially to fiber optical interferometers. In such a fiber optical interferometer a laser functions as a light source, the light of which is polarized and split by a beam splitter to provide two light beams which are passed through two light conductor fibers. One of these fibers functions as the measuring fiber and is thus exposed to the influence of a value to be measured, such as pressure or temperature which causes a change in length or a change in the refractive index of the light conductor fiber, whereby the light travelling through the measuring path is subjected to a phase shift relative to the light passing through a reference path formed by the other fiber which thus serves as a comparing fiber. The light flows or beams exiting at the fiber ends are superimposed at a further beam splitter to be received by two detectors. The detected signals are proportional to $\cos^2 \Delta\Phi$ and $\sin^2 \Delta\Phi$. Electronic circuits including computer circuits well known in the art calculate from these values the phase shift $\Delta\Phi$ and thus the value to be measured which is proportional to said phase shift $\Delta\Phi$.

A disadvantage of such interferometers which operate with polarized laser light is seen in that two light conductors are required and that two beam splitters must be used, the adjustment of which is rather involved. Additionally, it has been unavoidable heretofore that the polarization states or conditions of the two light conductor flows exiting at the fiber ends differ from each other.

OBJECTS OF THE INVENTION

In view of the above it is the aim of the invention to achieve the following objects singly or in combination:

to provide a fiber light conductor suitable for use in connection with mode interference methods by means of which it is possible to obviate a reference light conductor fiber similarly to a fiber optical Sagnac-interferometer;

to substantially reduce or minimize the efforts that have been necessary heretofore for the adjustment of the beam splitters and other optical components;

to produce a fiber light conductor which permits performing mode interference methods without the need for using polarized light; and to construct the fiber light conductor in such a manner that two light beams or flows travelling therethrough have a substantial transit time difference therebetween.

SUMMARY OF THE INVENTION

According to the invention there is provided a multilayer fiber light conductor which comprises two concentric light conductor zones which have different mode transit or propagation times relative to the fiber length which is the same for both zones.

Each light conductor zone has a small transit time or propagation time dispersion within the range of 10 to 100 ps/km·nm.

Fiber light conductors used heretofore in connection with mode interference methods have a stepped refractive index characteristic and are optimally adapted for data communication purposes. Thus, in prior art fiber light conductors the mutually interacting length of the individual modes is substantially equal to the measured value to be investigated. Accordingly, a substantial phase difference between the modes does not occur. Further, due to the substantial number of modes capable of propagation a complicated interference structure occurs in the detector which makes the evaluation of the measured result more difficult. Contrary thereto, the fiber light conductor according to the invention assures a simple mode structure and a high difference in the transit or propagation time between the two modes transmitted in the two light conductor zones.

Another advantage of the invention is seen in that no problems are encountered in coupling the present light conductor to a laser for performing a mode interference method. Part of the light rays impinging on the central core zone of the present light conductor have, relative to the fiber axis, an angle of incidence which exceeds the critical or limiting angle determined by the numeric aperture features. Therefore, these impinging light rays are not totally reflected at the interface between the central core zone and the concentric second light conductor zone so that the nonreflected portion enters into this second zone. Thus, both zones automatically are filled with light from a single source so that interference methods can be applied. Furthermore, by proper adjustment of angular and intensity distribution of the impinging laser light the power levels in the two zones can be optimized.

By providing in each individual light conductor zone a small transit or propagation time dispersion it is assured according to the invention that the characteristic features of the signal coupled to the light conductor are substantially maintained during the transmission.

It is especially advantageous if, for example, the inner core zone of the fiber light conductor has a stepped refractive index or modulus characteristic while the light conductor zone concentrically surrounding the core has a gradient type refractive index profile or characteristic. In this instance those light rays having, relative to the fiber axis, an angle of incidence larger than the critical or limiting angle of total reflection $\delta = \arcsin A_n$, are not totally reflected at the interface between the fiber core and the concentric fiber layer having a gradient type refraction index characteristic. Thus, these nonreflected light rays enter into the concentric gradient layer or second zone. Incidentally, the limiting angle of total reflection is determined by the numeric aperture $$A_n = \sqrt{n_1^2 - n_2^2},$$

wherein $n_1$ is the refractive index of the fiber core and $n_2$ is the refractive index of the adjacent zone of the concentric layer. To form the step characteristic $n_2$ will be smaller than $n_1$. It has been found that the influence of the radiation entering from the gradient fiber layer into the fiber core is small enough to be disregarded.

In case the gradient fiber layer is surrounded by a further concentric low loss protective layer having a constant refractive index ($n_4 < n_3$) then the refractive index of the gradient fiber layer which is dependent on the length of the radius of the gradient fiber layer is expressed as follows:

$$n(r) = n_2 \left[ 1 - 2\Delta \left( \frac{r}{r_2} \right)^2 \right]^{\frac{1}{2}}$$

wherein $$\Delta = \frac{n_2 - n_3}{n_2}$$

and wherein the following condition $r_1 \leq r \leq r_2$ is satisfied. $n_3$ corresponds to the refractive index of the gradient fiber layer at the interface between the latter and the outer protective layer and wherein $n_4$ is the refractive index of the outer protective layer.

A gradient fiber layer having a parabolic characteristic of its refractive index curve makes sure that all modes capable of propagation pass through the same optical distance or optical path length independently of the geometric path of these modes. Thus, transit or propagation time difference do not occur at the end of the fiber for all practical purposes. Accordingly, phase shifts which are measurable in the accordance with the mode interference method occur exclusively between the fiber core transmitting in the single mode and the surrounding gradient fiber layer which transmits modes with the same transit times.

By surrounding the conductor according to the invention with a magnetostrictive material on the outer surface thereof, it is possible to impose on the fiber length changes by an outer magnetic field, whereby measurable phase shifts occur. Such a fiber light conductor is thus especially suitable and advantageous for use as the sensor element in a magnetic field sensor.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
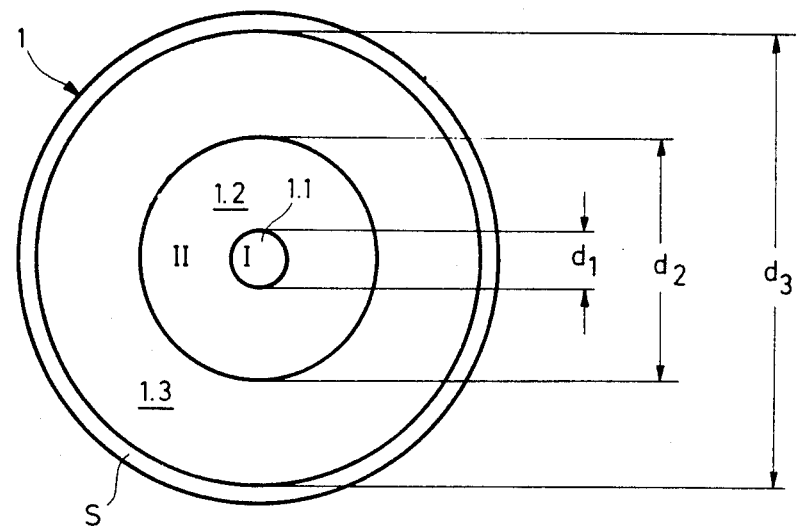
FIG. 1 is an end view of a light conductor according to the invention.

FIG. 1 shows an end view of a fiber light conductor 1 according to the invention having a central fiber core 1.1 which forms a first light conductor zone I surrounded by an outer light conductor fiber layer 1.2 forming a second light conductor zone II. These zones I and II have respective different mode transit or propagation times relative to the fiber length. The inner core 1.1 is made of a light conductor fiber having a constant refractive index $n_1$ and a diameter $d_1$. The second fiber layer 1.2 which concentrically surrounds the inner core 1.1 has a refractive index $n_3$ characteristic following a parabolic curve between the indexes $n_2$ and $n_3$. The largest diameter of the envelope 1.2 is $d_2$ whereby the thickness of the zone II is larger than the diameter $d_1$ of the inner core 1.1 as shown in FIG. 1 for transmitting separate optical signals in each of said light conducting zones I, II.

Figure 1A:
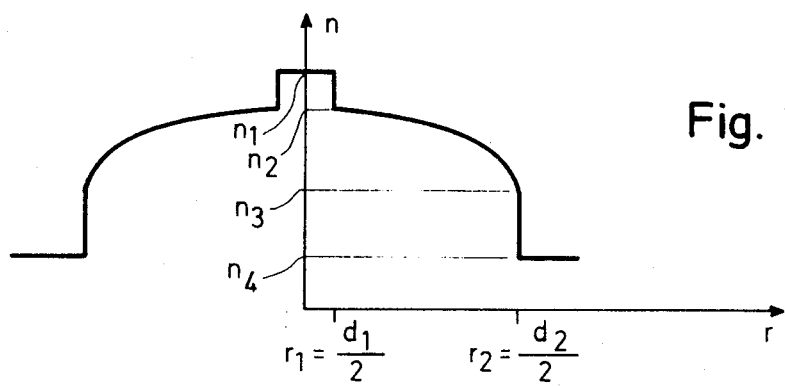
FIG. 1a illustrates the characteristic curves of the refractive indexes of the several zones in a light conductor of the invention.

FIG. 1a illustrates the characteristic curve of the refractive indexes. Thus, the constant refractive index $n_1$ forms a horizontal line corresponding in length to the diameter $d_1$. The refractive index $n_2$ is effective at the interface between the core 1.1 and the envelope 1.2. The refractive index $n_3$ is effective in or at the interface between the envelope 1.2 and a further fiber layer 1.3 concentrically surrounding the envelope 1.2. The fiber layer 1.3 has a constant refractive index $n_4$ and a diameter $d_3$. The refractive indexes for $n_1$ and $n_2$ and the diameter $d_1$ for the core 1.1 are so selected that the inner light conducting zone I forms a mono or single mode light conducting fiber. This may be achieved by satisfying the following known formula $$2\pi \frac{d_1}{\lambda} (n_1^2 - n_2^2)^{\frac{1}{2}} < 2.405,$$

wherein $\lambda$ is the wave length of the light transmitted through the light conductor.

The refractive index $n_2$ at the interface between the inner core 1.1 and the gradient fiber layer 1.2 at the inner radius $r_1$ is smaller than the refractive index $n_1$ of the core 1.1. Therefore, it is possible to obviate a separate refractive index jump for producing the single mode light conducting zone I. As mentioned, the fiber layer 1.2 is surrounded by a fiber layer 1.3 having a constant refractive index $n_4$ and a maximum diameter $d_3$, whereby the light conductor zone II having the gradient index profile or characteristic is formed. Thus, at the interface between the fiber layers 1.2 and 1.3 a further refractive index jump from $n_3$ to $n_4$ occurs. The entire light conductor fiber is surrounded in a manner known as such by a protective jacket S which may be made of magnetostrictive material or which may be coated with such magnetostrictive material whereby the fiber light conductor may be used as a magnetic field sensor.

A light conductor according to the invention which is sensitive to pressure variations and thus suitable for use in connection with interferometric measurements with light having a wave length $\lambda$ of 0.85 micrometer ($\mu$m) may be realized by the following values: $d_1 = 3$ $\mu$m, $d_2 = 150$ $\mu$m, $n_1 = 1.475$, $n_2 = 1.47$, $n_3 = 1.46$, $n_4 = 1.45$.

Figure 2:
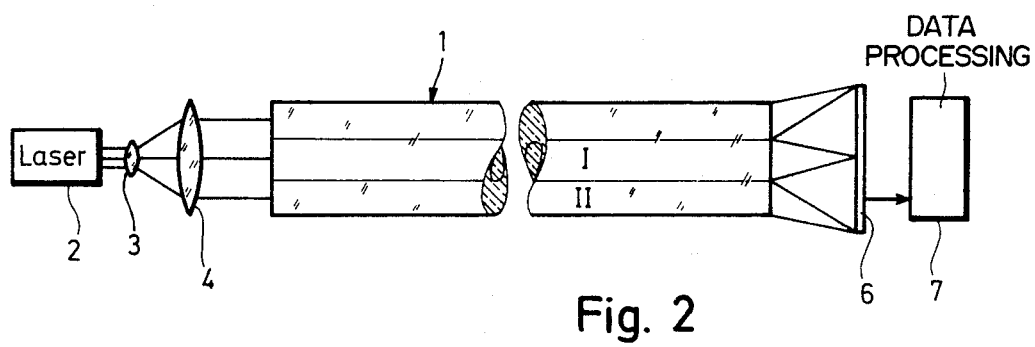
FIG. 2 illustrates an interferometer equipped with a light conductor according to the invention.

FIG. 2 illustrates an apparatus for performing a mode interference method. A light conductor 1 according to the invention having two light conducting zones I and II is operatively connected at one end thereof to a laser 2 by means of optical lenses 3 and 4 forming an input or coupling optical means. The output end of the light conductor 1 is connected to a detector 6 which in turn supplies its output signal to electronic data processing means 7. In order to assure a uniform illumination of the fiber cross-sectional area and thus an effective coupling of the laser light into the light conductor it is preferable to illuminate the end surface of the light conductor with parallel light. Upon transmission of the light through the sensing fiber 1 the output light at the monomode transmitting zone I and at the multimode transmitting zone II is superimposed to form an interference figure in the detector 6 located in the remote radiation field. The value to be measured causes phase shifts which in turn vary the interference image. For example, the interference band may start running which may be evaluated in a conventional manner.

German Patent Publication (DE-AS) No. 2,352,003 discloses methods for producing multilayer light conductor fibers. Accordingly, a fiber according to the invention could also be produced, for example, by a suitable coating of a glass tube of refractive index $n_4$ which is subsequently heated so that it may be drawn to the desired cross-section. The coating material may, for example be fused silica for making the zones I and II. The outer layer S may, for example, be made of nickel to have the required magnetostrictive characteristics.

Although the invention has been described with reference to specific example embodiments, it will be appreciated, that it is intended, to cover all modifications and equivalents within the scope of the appended claims.

What is claimed is:

1. A multilayer fiber light conductor, comprising a first central light conductor member (1.1) having a given diameter, and a second light conductor member (1.2) concentrically surrounding said first central light conductor member, said second light conductor having a thickness larger than said given diameter of said first light conductor member, both light conductor members having the same given fiber length, said light conductor members forming respective separate light conducting zones (I, II) having different mode transit times relative to said given fiber length for separate transmission of separate optical signals in each of said light conducting zones (I, II), whereby the fiber light conductor is suitable for use in mode interference methods.

2. The fiber light conductor of claim 1, wherein each of said light conducting zones exhibits a small transit or propagation time dispersion within the range of 10 to 100 ps/km·nm.

3. The fiber light conductor of claim 1 or 2, wherein one of said light conducting zones has a stepped refractive index profile, and wherein the other light conducting zone has a gradient type refractive index profile.

4. The fiber light conductor of claim 3, wherein said first central light conductor member forming said one zone (1) having said stepped refractive index profile, is constructed as a monomode fiber or light conductor member.

5. The fiber light conductor of claim 1 or 2, wherein said first central light conductor member (1.1) forms a fiber core having a constant refractive index ($n_1$), and wherein said second light conductor member forms a concentric fiber layer around the fiber core, said fiber layer having a gradient type refractive index ($n(r)$) which diminishes radially outwardly in accordance with a parabolic function.

6. The fiber light conductor of claim 5, wherein said gradient type refractive index ($n(r)$) of said fiber layer has a value at the interface between said fiber core and the fiber layer which value is smaller than the value of the refractive index ($n_1$) of the fiber core.

7. The fiber light conductor of claim 5, further comprising a further fiber layer (1.3) concentrically surrounding said fiber layer (1.2), said further fiber layer (1.3) having a constant refractive index ($n_4$).

8. The fiber light conductor of claim 6, further comprising a further fiber layer (1.3) concentrically surrounding said fiber layer (1.2), said further fiber layer (1.3) having a constant refractive index ($n_4$).

9. The fiber light conductor of claim 7 or 8, further comprising a protective outer jacket (S) concentrically surrounding said further layer (1.3).

10. The fiber light conductor of claim 9, wherein said protective outer jacket is made of a magnetostrictive material for providing a magnetic field sensor.

11. The fiber light conductor of claim 9, wherein said protective outer jacket is coated with a magnetostrictive material for providing a magnetic field sensor.

* * * * *